United States Patent [19] [11] 4,184,106

Schaas [45] Jan. 15, 1980

[54] VERTICAL DEFLECTION CIRCUIT FOR A TELEVISION RECEIVER

[75] Inventor: Gerhard Schaas, Rödental, Fed. Rep. of Germany

[73] Assignee: Loewe-Opta GmbH, Kronach, Fed. Rep. of Germany

[21] Appl. No.: 929,042

[22] Filed: Jul. 28, 1978

[30] Foreign Application Priority Data

Aug. 3, 1977 [DE] Fed. Rep. of Germany ....... 2734980

[51] Int. Cl.[2] .............................................. H01J 29/70

[52] U.S. Cl. ..................................... 315/403; 315/408

[58] Field of Search ................................ 315/403, 408

[56] References Cited

U.S. PATENT DOCUMENTS

| | | | |
|---|---|---|---|
| 3,914,654 | 10/1975 | Cooksey | 315/408 |
| 3,969,653 | 7/1976 | Fukaya | 315/403 |
| 3,983,452 | 9/1976 | Bazin | 315/403 X |

*Primary Examiner*—Malcolm F. Hubler

[57] ABSTRACT

A television vertical deflection circuit is disclosed. A sawtooth generator is connected to a driver circuit and this circuit is in turn connected through a capacitor to an output amplifier, which powers vertical deflection coils of a television receiver. A first voltage source is connected through a forward diode to the output amplifier. A second voltage source is connected through switching means to the output amplifier. A signal from the driver circuit to the base of a transistor of switching means shuts the first voltage source off and turns the second voltage source on.

10 Claims, 1 Drawing Figure

UB2

UB1

11

9

10

12

2

7

8

A

3

4

5

1

SAW TOOTH GENERATOR AND DRIVER CIRCUIT

6

VERTICAL DEFLECTION CIRCUIT FOR A TELEVISION RECEIVER

BACKGROUND OF THE INVENTION

The present invention relates to a deflection circuit for the deflection coils of a television receiver.

Present techniques for powering vertical deflection coils of television receivers employ predominantly low voltage vertical deflection circuits. In general, such circuits comprise a sawtooth generator and a driver circuit, the output of which is connected to a linear output amplifier. The sawtooth generator employs a conventional integrated circuit comprising the elementary circuit groups of oscillator, feedback oscillator and voltage control circuit. The generator is synchronized by the vertical synchronizing pulses, providing for vertical deflection according to the existing picture cycle frequency.

During the sweep a time linear sawtooth shaped deflection current is generated in the deflection coil, which is in operation slightly S-shaped and which contributes to the compensation of possible tangent errors. During the sweep the voltage runs like the deflection current linearly with time. However, during retrace the voltage is proportional to the rate of current change of the deflection current resulting in a noticeable increase in voltage during return. Consequently, a higher operating voltage has to be applied to the vertical output amplifier during flyback in order to meet the return time. For this purpose conventional circuits provide for nearly doubling of the applied operating voltage through a voltage doubling circuit, although the really necessary voltage increase is considerably lower. Therefore, conventional vertical output amplifiers have to be constructed with expensive voltage proof devices in the output amplifier. Employing a conventional voltage doubling circuit results in the disadvantage of generating relatively high charge and recharging losses when the voltage is increased. Applying the higher operation voltages during sweep and retrace results in a high power loss in the output amplifier during the sweep, which generates heat which in turn has to be removed by providing appropriate cooling fins to the circuit casing.

SUMMARY OF THE INVENTION

It is an object of the invention to provide a low loss vertical deflection circuit.

It is another object to provide a vertical deflection circuit built with elements requiring relatively low voltage stability.

It is another object of the invention to provide a vertical deflection circuit not requiring voltage doubling circuitry.

These and other objects and advantages of the present invention will become evident from the description which follows.

A vertical deflection circuit for television receivers is disclosed, which generates a sawtooth shaped vertical deflection current in the vertical deflection coils of the deflection unit of the picture tube. The vertical deflection circuit comprises a sawtooth generator synchronized by a vertical oscillator, a driver circuit connected to the sawtooth generator and a linear output amplifier connected to the driver circuit and to the vertical deflection coils. Electronic switching means is connected to a first voltage source, to a second voltage source having a voltage at least resulting in a vertical retrace time within a predefined return time, to the driver circuit and to the linear output amplifier for switching off the first voltage source, being connected during the sweep to the output amplifier, at the moment of the start of the vertical retrace and for switching on the second voltage sources and applying same to the output amplifier, said switching being controlled by a control signal synchronized with the vertical retrace signal. The second voltage source provides preferably a higher voltage than the first source and preferably provides also the power to the sawtooth generator and to the driver circuit. Alternatively, the sawtooth voltage at the input of the output amplifier is compared with the voltage at a grounded resistor of the deflection coil for generating a control signal for the switching means at the point in time when the voltage at the grounded resistor due to the rate of current change in the coil is higher than the comparison voltage. Preferably the vertical deflection circuit may employ for the switching means a non-switching transistor having the control signal fed into its base connection for providing a switch for applying the second voltage source to the output amplifier; and a forward diode in series connected to the first voltage source for disconnecting the first voltage source upon connection of the second voltage source to the power input of the output amplifier. A first capacitor can serve as an AC coupling of the sawtooth generator via the driver circuit to the output amplifier. A second capacitor can serve for AC coupling of the driver circuit to the switching means. The second capacitor can be charged by the second voltage source through a dividing network to a predefined voltage and application of a control signal can increase the voltage such as to switch the switching means to turn on the higher second voltage.

The invention accordingly consists in the features of construction, combination of elements and arrangement of parts which will be exemplified in the device hereinafter described and of which the scope of application will be indicated in the appended claims.

BRIEF DESCRIPTION OF THE DRAWING

In the accompanying drawing in which is shown one of the various possible embodiments of the invention.

DETAILED DESCRIPTION OF THE PREFERRED EMBODIMENTS

Figure 1:
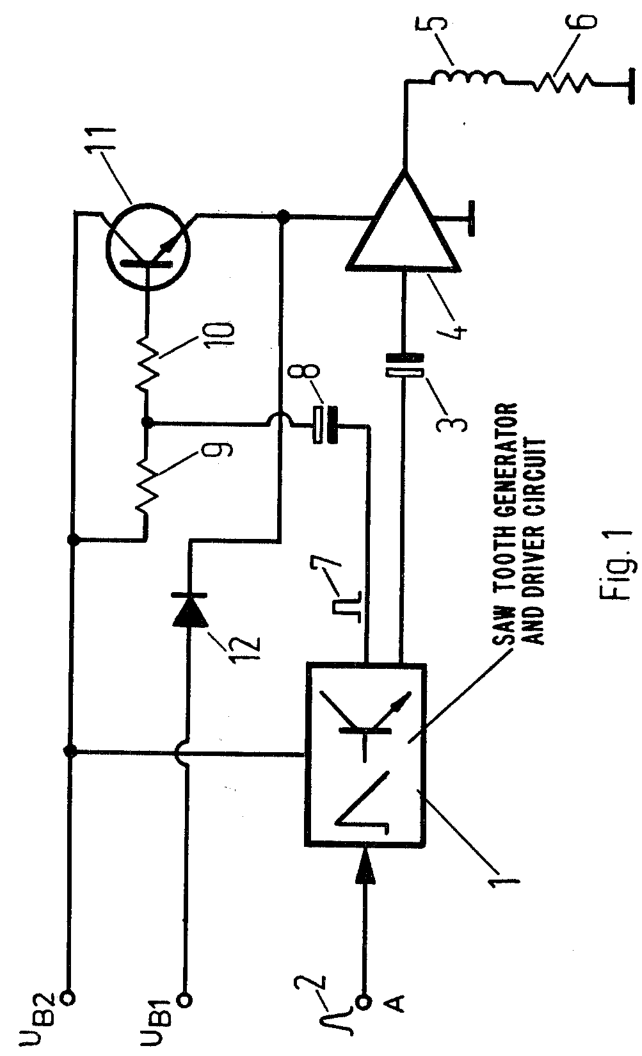
FIG. 1 is a schematic circuit diagram of a vertical deflection circuit for a television receiver.

A sawtooth generator is synchronized by a vertical oscillator and its output connected to a driver circuit and the driver circuit in turn is connected to a linear output amplifier for driving the vertical deflection coils. An electronic switching means turns on a first voltage source during sweep time and a second voltage source during retrace time. The second voltage source provides a voltage sufficient for resulting in a retrace time within a set return time. The switching is controlled by a control signal synchronized with the vertical retrace signal. Preferably, the higher voltage of the second voltage source is employed not only as operating voltage for the output amplifier during flyback time but also as voltage for optimal operation of the sawtooth generator and driver circuit. This possibility arises because the operating voltage of the driving stage being generally about 10 volts higher is compared with the operating voltage of the output stage during sweep time being near about 25 volts for low voltage vertical deflection circuits. Employing a conventional voltage doubling circuit the operating voltage of the output stage during retrace would be about 50 volts. However, employing according to the present invention a second voltage source to provide the operating voltage for the driving stage of about 32 to 35 volts and applying this voltage to the output amplifier during retrace results in a lower voltage at the amplifier. By applying this adapted operating voltage the operating losses are minimized and an optimal operating condition arises for the deflection circuit. Furthermore no extreme requirements are to be met for the voltage strength of the output stage. Furthermore, by providing for a DC-decoupling of the driver stage and of the output stage and by providing an AC-coupling of the driver stage to the output stage, the saturation voltages of the driver stage and the relatively large variations of the operating point of the driver stage do not affect the size of the voltage at the output stage. Variations in the driver stage resulting from the devices employed do not have to be compensated for in the output stage by a corresponding increase in the operating voltage. Similarly, by providing an AC-coupling of the signal providing circuit of the driver stage or of a separate driver stage to the switching means a DC-decoupling is achieved. Thus employing a transistor switch, a control signal applied through a capacitor to the base of the transistor switch increases the voltage potential at the base to such an extent as to turn the transistor conductive.

Referring now to FIG. 1, there is shown a simplified block diagram of a vertical deflection circuit. A first stage 1 comprising a sawtooth generator and an integrated driver circuit is powered by an operating voltage $U_{B2}$. Vertical synchronizing signals applied at input A synchronize the first stage. The generating part of the first stage is conventional and can be obtained e.g. as vertical deflection circuit TDA 1170 from SGS Company, Ates, Germany. The output of the first stage is connected by a capacitor 3 to an output amplifier 4. The output of the amplifier 4 is connected to deflection coil 5 of a picture tube deflection unit and coil 5 is grounded through a resistor 6. The first stage comprises an integrated circuit generating a control signal depending on the vertical synchronizing pulses 2 and transmitting same at the moment of beginning retrace. Alternatively, the pulses can be generated by comparing the sawtooth voltage at the grounded resistor 6 of the deflection coil 5 with the sawtooth voltage of the sawtooth generator. The control signal 7 results in a charge shift of the capacitor 8 which is precharged through a voltage dividing network comprising resistors 9 and 10, which resistor 10 is connected to the base of a switch transistor 11. The switch transistor 11 is connected to the voltage source $U_{B2}$ through its collector and through the voltage divider 9, 10 and the emitter of transistor 11 is connected to the power input of the output amplifier 4. The switch transister 11 is of the npn-type. The power input of the output amplifier 4 is also connected through a forward diode 12 to the always connected voltage source $U_{B1}$. At the time of beginning retrace a control pulse 7 is generated for increasing the defined voltage level of the base of transistor 11 such as to turn the transistor conductive. This results in application of the voltage from source $U_{B2}$ to the power input of the output amplifier 4. Since the voltage of source $U_{B2}$ is larger than the voltage of source $U_{B1}$ to diode turns nonconducting and the voltage source $U_{B1}$ is switched off. From the moment of the start of the retrace the voltage of the voltage source $U_{B2}$ is applied to the power input of the output amplifier 4.

It thus will be seen that there is provided a device which achieves the various objects of the invention and which is well adapted to meet the conditions of practical use.

As various possible embodiments might be made of the above invention, and as various changes might be made in the embodiment above set forth, it is to be understood that all matter herein described or shown in the accompanying drawing is to be interpreted as illustrative and not in a limiting sense.

What is claimed is:

1. A vertical deflection circuit for a television receiver for generating a sawtooth shaped vertical deflection current in the vertical deflection coils of the deflection unit of the picture tube, comprising:

a sawtooth generator synchronized by a vertical oscillator;

a driver circuit connected to the sawtooth generator;

a linear output amplifier connected to the driver circuit and to the vertical deflection coils;

a first voltage source;

a second voltage source, having a voltage at least resulting in a vertical retrace time within a predefined return time; and an electronic switching means connected to the first voltage source, to the second voltage source, to the driver circuit and to the linear output amplifier for switching off the first voltage source, said first voltage source being connected to the output amplifier during the sweep and at the moment of the start of the vertical retrace, and for switching on the second voltage source and applying same to the output amplifier; said switching being controlled by a control signal synchronized with the vertical retrace signal.

2. The vertical deflection circuit for a television receiver as set forth in claim 1, wherein the first voltage source connected during sweep to the output amplifier is switched off at the beginning of the retrace; and wherein the second voltage source with the higher voltage is connected such as to provide operating power to the sawtooth generator and to the driver circuit.

3. The vertical deflection circuit for a television receiver as set forth in claim 1, wherein the control signal for controlling switching means is generated by comparing the sawtooth voltage at the input of the output amplifier with the voltage at the grounded resistor of the deflection coil in a comparison circuit, depending on the point in time of surpassing of the voltage at the deflection coil due to the rate of current change in the deflection coil resulting in a voltage increase above the value of the comparison voltage.

4. The vertical deflection circuit for a television receiver as set forth in claim 1, wherein the sawtooth voltage at the input of the output amplifier is compared with the voltage at the grounded resistor of the deflection coil for generating a control signal for the switching means at the point in time when the voltage at the grounded resistor, due to the rate of current change in the coil, is higher than the comparison voltage.

5. The vertical deflection circuit for a television receiver as set forth in claim 1, comprising:

an npn-switching transistor having the control signal fed into its base connection for providing a switch for applying the second voltage source to the power input of the output amplifier; and a diode in series connected to the first voltage source in a forward direction for blocking the first voltage source upon connection of the second voltage source to the power input of the output amplifier.

6. The vertical deflection circuit for a television receiver as set forth in claim 5, wherein the sawtooth generator circuit via the driver circuit is AC-connected to the output amplifier through a first capacitor;

wherein the control circuit and the driver circuit, respectively, are AC-coupled through a second capacitor for controlling the switching means;

wherein the second coupling capacitor is charged by the second voltage source through a voltage divider to a predefined voltage; and wherein application of a control signal increases the voltage such as to switch the switching means to turn on the higher second voltage.

7. The vertical deflection circuit for a television receiver as set forth in claim 5, comprising a first coupling capacitor connected between the driver circuit and the output amplifier.

8. The vertical deflection circuit for a television receiver as set forth in claim 5, comprising a second coupling capacitor connected between the driver circuit and the switching means.

9. The vertical deflection circuit for a television receiver as set forth in claim 8, comprising a voltage divider between the second voltage source and the second coupling capacitor for charging the second capacitor to a predefined voltage.

10. The vertical deflection circuit for a television receiver as set forth in claim 9, wherein application of a control signal to the second coupling capacitor increases the voltage such as to switch the switching means for turning on the higher voltage.

* * * * *